(12) United States Patent
Veidhes et al.

(10) Patent No.: US 10,891,889 B2
(45) Date of Patent: Jan. 12, 2021

(54) DISPLAY DEVICE

(71) Applicant: Samsung Display Co., Ltd., Yongin-si (KR)

(72) Inventors: Basrur Veidhes, Yongin-si (KR); Seongyoung Lee, Hwaseong-si (KR); Doyeong Park, Hwaseong-si (KR); Jinsu Lee, Suwon-si (KR); Kun-Wook Han, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/114,040

(22) Filed: Aug. 27, 2018

(65) Prior Publication Data

US 2019/0213940 A1   Jul. 11, 2019

(30) Foreign Application Priority Data

Jan. 5, 2018   (KR) .................... 10-2018-0001826

(51) Int. Cl.
*H01L 27/12*   (2006.01)
*G09G 3/20*    (2006.01)
(Continued)

(52) U.S. Cl.
CPC ......... *G09G 3/2003* (2013.01); *G02F 1/1343* (2013.01); *G02F 1/133345* (2013.01); (Continued)

(58) Field of Classification Search
CPC ............. G09G 3/3607; G09G 3/2003; G02F 1/133345; G02F 1/133514; G02F 1/1343; G02F 1/136286; H01L 27/1214
See application file for complete search history.

(56) References Cited

U.S. PATENT DOCUMENTS 7,180,559 B2    2/2007 Chang et al.
2004/0109102 A1*  6/2004 Chang ............... G02F 1/134336
                                              349/44
(Continued)

FOREIGN PATENT DOCUMENTS

KR    10-2005-0000447    1/2005
KR    10-2005-0058907    6/2005
KR      10-0864410      10/2008

*Primary Examiner* — Amare Mengistu
*Assistant Examiner* — Cory A Almeida
(74) *Attorney, Agent, or Firm* — H.C. Park & Associates, PLC

(57) ABSTRACT

A display device capable of substantially preventing light leakage generated in a non-display area of the display device, the display device including: a substrate including a display area and a non-display area; a thin film transistor disposed in the display area; a first connection electrode disposed in the non-display area and connected to the thin film transistor; a second connection electrode disposed in the non-display area and disposed apart from the first connection electrode; a first insulating layer overlapping one end portion of the first connection electrode and one end portion of the second connection electrode; a floating electrode disposed on the first insulating layer; and a bridge electrode disposed on the second insulating layer, connected to the first connection electrode through a first contact hole, and connected to the second connection electrode through a second contact hole.

22 Claims, 10 Drawing Sheets

(51) Int. Cl.
*G02F 1/1333* (2006.01)
*G02F 1/1335* (2006.01)
*G02F 1/1343* (2006.01)
*G02F 1/1362* (2006.01)
*G09G 3/36* (2006.01)

(52) U.S. Cl.
CPC .. *G02F 1/133514* (2013.01); *G02F 1/136286* (2013.01); *H01L 27/1214* (2013.01); *G02F 2201/123* (2013.01); *G09G 3/3607* (2013.01); *G09G 2300/0426* (2013.01); *G09G 2310/08* (2013.01)

(56) References Cited

U.S. PATENT DOCUMENTS

| | | | |
|---|---|---|---|
| 2008/0169470 A1* | 7/2008 | Lim | H01L 27/1214 257/59 |
| 2015/0370116 A1* | 12/2015 | Chae | G02F 1/13394 349/43 |
| 2018/0076233 A1* | 3/2018 | Park | H01L 23/544 |

\* cited by examiner

DISPLAY DEVICE

CROSS REFERENCE TO RELATED APPLICATION

This application claims priority from and the benefit of Korean Patent Application No. 10-2018-0001826, filed on Jan. 5, 2018, which is hereby incorporated by reference for all purposes as if fully set forth herein.

BACKGROUND

Field

Exemplary embodiments of the invention relate generally to a display device and, more specifically, to a display device for substantially preventing light leakage that may occur in a non-display area.

Discussion of the Background

In recent information society, display devices are becoming more important as a visual information delivery medium. In order to take a major position in the future, it is necessary to meet requirements such as low power consumption, reduced thickness, light weight, and high image quality.

Such display devices may be classified into a self-luminous type, such as a cathode ray tube ("CRT") display device, an electroluminescence ("EL") display device, a light emitting diode ("LED") display device, a vacuum fluorescent display ("VFD") device, a field emission display ("FED") device, and a plasma display panel ("PDP") device, and a non-self-luminous type such as a liquid crystal display ("LCD") device.

Among them, the LCD device is a device for displaying images using optical anisotropy of liquid crystals. Since the LCD devices have superior visibility as compared to the conventional cathode-ray tubes and have a reduced average power consumption and a reduced heat generation as compared to cathode ray tubes of the same screen size, they have recently been regarded as a next-generation display device, along with the PDP and the FE) devices.

The above information disclosed in this Background section is only for understanding of the background of the inventive concepts, and, therefore, it may contain information that does not constitute prior art.

SUMMARY

Exemplary embodiments of the invention are directed to a display device capable of substantially preventing light leakage generated in a non-display area of the display device and display defects due to the static electricity transmitted from the outside.

Additional features of the invention will be set forth in the description which follows, and in part will be apparent from the description, or may be learned by practice of the invention.

An exemplary embodiment of the invention provides a display device including a substrate including a display area and a non-display area; a thin film transistor disposed in the display area; a first connection electrode disposed in the non-display area and connected to the thin film transistor; a second connection electrode disposed in the non-display area and disposed apart from the first connection electrode; a first insulating layer overlapping one end portion of the first connection electrode and one end portion of the second connection electrode; a floating electrode disposed on the first insulating layer; and a bridge electrode disposed on the second insulating layer, connected to the first connection electrode through a first contact hole, and connected to the second connection electrode through a second contact hole.

The display device may further include a second insulating layer disposed between the floating electrode and the bridge electrode.

The display device may further include a gate e and a data line connected to the thin film transistor.

The display device may further include a first color filter overlapping the gate line, the data line, and the thin film transistor; and a second color filter overlapping the first color filter.

The first color filter may be disposed apart from the first contact hole and the second contact hole in the non-display area, and the second color filter may be disposed apart from the floating electrode in the non-display area and overlaps the first color filter.

The thin film transistor may include: a gate electrode connected to the gate line; a semiconductor layer overlapping the gate electrode; a source electrode connected to the data line and overlapping one end portion of the semiconductor layer; and a drain electrode disposed apart from the source electrode and overlapping another end portion of the semiconductor layer.

The first connection electrode may be connected to the gate line.

The first connection electrode and the second connection electrode may include a material substantially the same as a material included in the gate line and the gate electrode.

The floating electrode may include a material substantially the same as a material included in the data line, the source electrode, and the drain electrode.

The display device may further include a pixel electrode connected to the drain electrode. The bridge electrode may include a material substantially the same as a material included in the pixel electrode.

Another exemplary embodiment provides a display device including: a substrate including a display area and a non-display area; a thin film transistor disposed in the display area; a floating electrode disposed in the non-display area; a first insulating layer disposed on the floating electrode; a first connection electrode connected to the thin film transistor and overlapping at least a portion the floating electrode; a second connection electrode disposed apart from the first connection electrode in the non-display area and overlapping at least a portion of the floating electrode; and a bridge electrode connected to the first connection electrode through a first contact hole and connected to the second connection electrode through a second contact hole.

The display device may further include a second insulating layer disposed between the floating electrode and the bridge electrode.

The display device may further include a gate line and a data line connected to the thin film transistor.

The display device may further include a first color filter overlapping the gate line, the data line, and the thin film transistor; and a second color filter overlapping the first color filter.

The first color filter may be disposed apart from the first contact hole and the second contact hole in the non-display area, and the second color filter may be disposed apart from the floating electrode in the non-display area and overlaps the first color filter.

The thin film transistor may include: a gate electrode connected to the gate line; a semiconductor layer overlapping the gate electrode; a source electrode connected to the data line and overlapping one end portion of the semiconductor layer; and a drain electrode disposed apart from the source electrode and overlapping another end portion of the semiconductor layer.

The first connection electrode may be connected to the gate line.

The first connection electrode and the second connection electrode may include a material substantially the same as a material included in the data line, the source electrode, and the drain electrode.

The floating electrode may include a material substantially the same as a material included in the gate line and the gate electrode.

The display device may further include a pixel electrode connected to the drain electrode. The bridge electrode may include a material substantially the same as a material included in the pixel electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
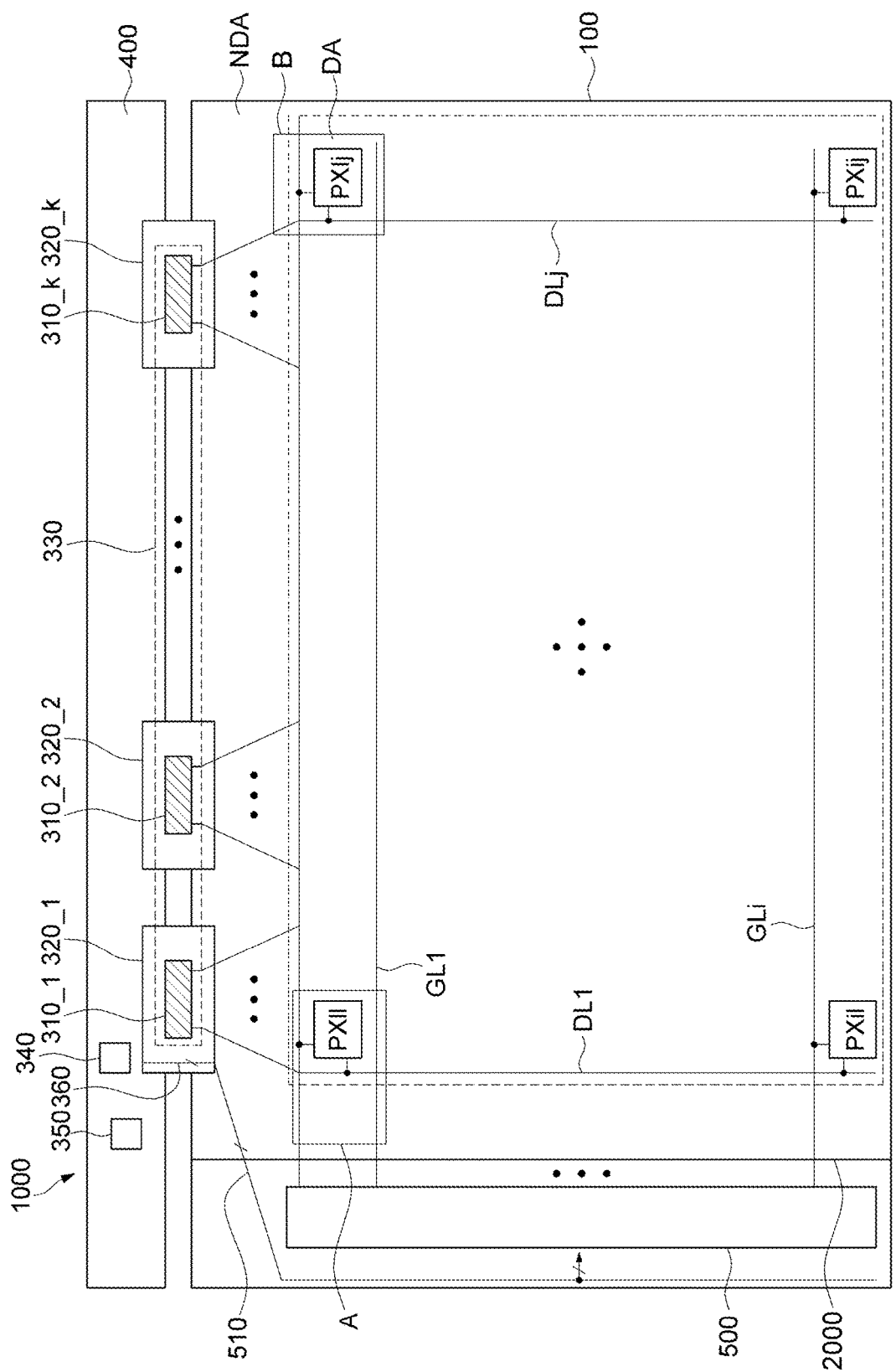
FIG. 1 a view illustrating a display device according to an exemplary embodiment of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or to groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Some of the parts which are not associated with the description may not be provided in order to specifically describe exemplary embodiments of the invention and like reference numerals refer to like elements throughout the specification.

FIG. 1 a view illustrating a display device according to an exemplary embodiment of the invention.

A display device 1000 according to an exemplary embodiment of the invention includes a first panel 100, a second panel 200, a data driver 330, a gate driver 500, a circuit board 400, a power supply 340, and a timing controller 350, as illustrated in FIG. 1.

The power supply 340 and the timing controller 350 are located on the circuit board 400.

The timing controller 350 receives a vertical synchronization signal, a horizontal synchronization signal, an image data signal, and a reference clock signal, which are output from a graphic controller (not illustrated) provided in a system (not illustrated).

An interface circuit (not illustrated) is provided between the timing controller 350 and the system, and the aforementioned signals output from the system are input to the timing controller 350 through the interface circuit. The interface circuit may be embedded in the timing controller 350.

The timing controller 350 generates a gate control signal for controlling the gate driver 500 and a data control signal for controlling the data driver 330, using the vertical synchronization signal, the horizontal synchronization signal, and the reference clock signal.

The gate control signal may include clock signals, a vertical start signal, and a common reset control signal.

The data control signal may include a source start pulse, a source shift clock, a source output enable signal, a polarity signal, and the like.

In addition, the timing controller 350 rearranges the image data signals input through the system, and applies the rearranged image data signals to the data driver 330.

The first panel 100 is divided into a display area DA and a non-display area NDA.

The first panel 100 may be a panel used for various kinds of display devices, such as a liquid crystal display ("LCD") panel or an organic light emitting diode ("OLED") panel.

The first panel 100 includes a plurality of data lines DL1 to DLj, a plurality of gate lines GL1 to GLi, and a plurality of pixels PX11 to PXij, where i and j each are a natural number greater than 1.

The data lines DL1 to DLj cross the gate lines GL1 to GLi. The data lines DL1 to DLj extend to the non-display area NDA to be connected to the data driver 330.

The data driver 330 includes a plurality of data driving integrated circuits ("ICs") 310_1, 310_2, . . . and 310_k. The data driving ICs 310_1, 310_2, . . . and 310_k receive the digital image data signals and the data control signal applied from the timing controller 350.

The data driving ICs 310_1, 310_2, . . . and 310_k sample the digital image data signals according to the data control signal, latch the sampled digital image data signals corresponding to one horizontal line in each horizontal period, and apply the latched image data signals to the data lines DL1 to DLj. That is, the data driving ICs 310_1, 310_2, . . . and 310_k convert the digital image data signals applied from the timing controller 350 into analog image signals using a gamma voltage input from the power supply 340, and apply the converted analog image signals to the data lines DL1 to DLj.

The data driving ICs 310_1, 310_2, . . . and 310_k are mounted on data carriers 320_1, 320_2, . . . and 320_k, respectively. The data carriers 320_1, 320_2, . . . and 320_k are connected between the circuit board 400 and the first panel 100. For example, each of the data carriers 320_1, 320_2, . . . and 320_k may be electrically connected between the circuit board 400 and the non-display area NDA of the first panel 100.

The data carriers 320_1, 320_2, . . . and 320_k include input wirings for transmitting various signals applied from the timing controller 350 and the power supply 340 to the data driving ICs 310_1, 310_2, . . . and 310_k, and output wirings for transmitting image data signals output from the data driving ICs 310_1, 310_2, . . . and 310_k to the corresponding ones of the data lines DL1 to DLj. In an exemplary embodiment, at least one carrier 320_1 may further include auxiliary wirings 360 for transmitting various signals from the timing controller 350 and the power supply 340 to the gate driver 500. The auxiliary wirings 360 are connected to panel wirings 510 located at the first panel 100. The panel wirings 510 connect the auxiliary wirings 360 and the gate driver 500 to each other. The panel wirings 510 may be formed on the non-display area NDA of the first panel 100 in a line-on-glass manner.

The pixels PX11 to PXij are disposed in the display area DA of the first panel 105. The pixels PX11 to PXij are arranged in a matrix form. The pixels PX11 to PXij may include a red pixel for displaying a red image, a green pixel for displaying a green image, and a blue pixel for displaying a blue image. The red pixel, the green pixel and the blue pixel that are adjacently disposed in a horizontal direction may define a unit pixel for displaying a unit image.

There are "j" number of pixels arranged along a p-th (p being one selected from 1 to i) horizontal line (hereinafter, p-th horizontal line pixels), which are connected to the first to $j^{th}$ data lines DL1 to DLj, respectively. Further, the p-th horizontal line pixels are connected in common to the p-th gate line. Accordingly, the p-th horizontal line pixels receive a p-th gate signal as a common signal. That is, "j" number of pixels disposed in the same horizontal line receive the same gate signal, while pixels disposed in different horizontal lines receive different gate signals, respectively. Herein, p is a natural number equal to or greater than 1 and equal to or less than i.

Each of the pixels PX11 to PXij may include a pixel transistor, a liquid crystal capacitor, and a storage capacitor, although not illustrated. The pixel transistor is a thin film transistor, for example.

The pixel transistor is turned on according to a gate signal applied from the gate line. The turned-on pixel transistor applies the analog image data signal applied from the data line to the liquid crystal capacitor and the storage capacitor.

The liquid crystal capacitor includes a pixel electrode and a common electrode which oppose each other.

The storage capacitor includes a pixel electrode and an opposing electrode which oppose each other. Herein, the opposing electrode may be a previous gate line or a transmission line which transmits a common voltage.

The gate lines GL1 to GLi are driven by the gate driver 500, and the gate driver 500 includes a shift register.

The clock signals from the timing controller 350 and voltages from the power supply 340 are applied to the shift register of the gate driver 500 through the auxiliary wirings 360 and the panel wirings 510.

Hereinafter, the display device according to an exemplary embodiment of the invention will be described in detail with reference to FIGS. 2 to 5.

Figure 2:
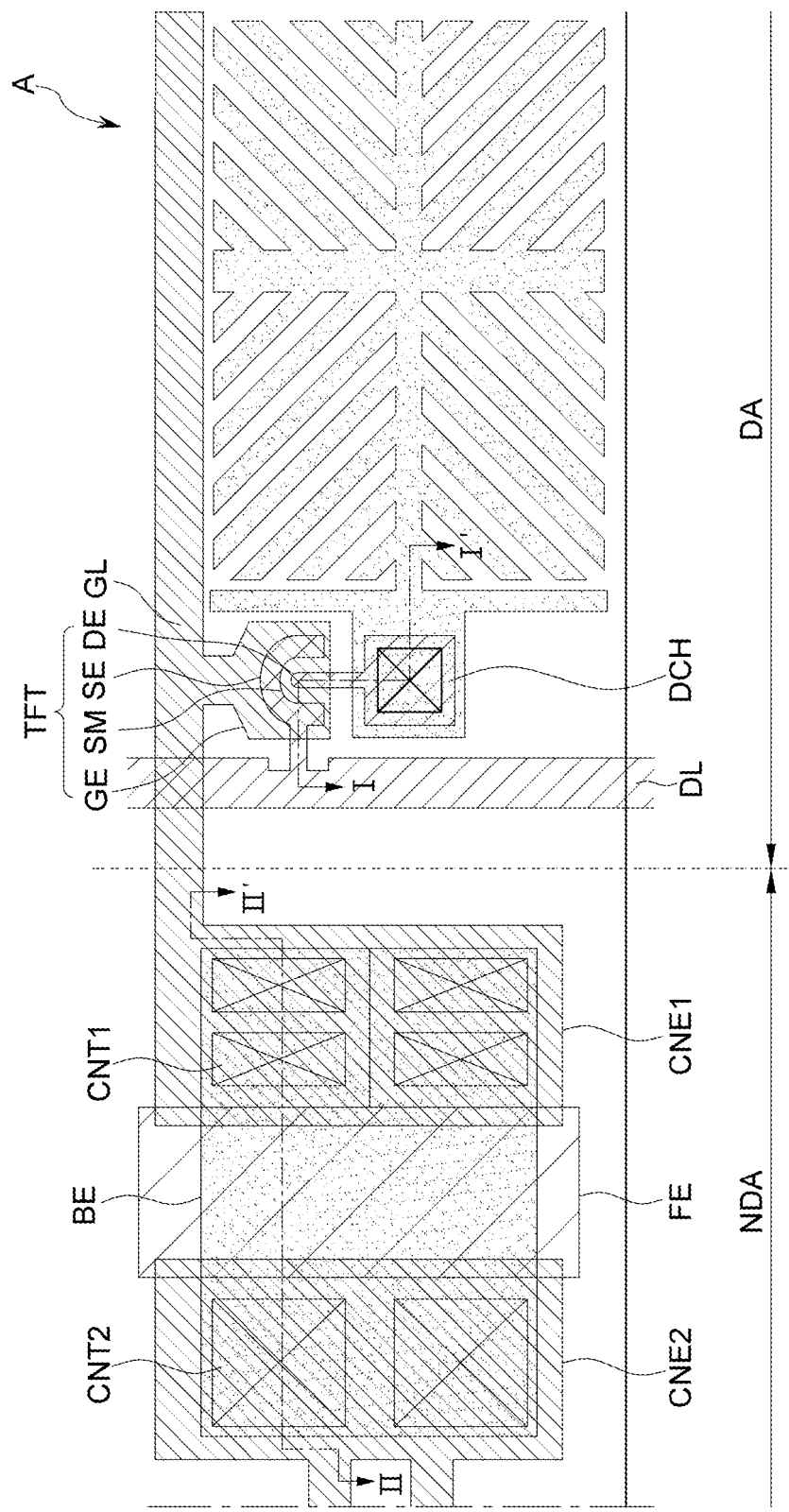
FIG. 2 is a view enlarging a portion "A'" in FIG. 1.
Figure 3:
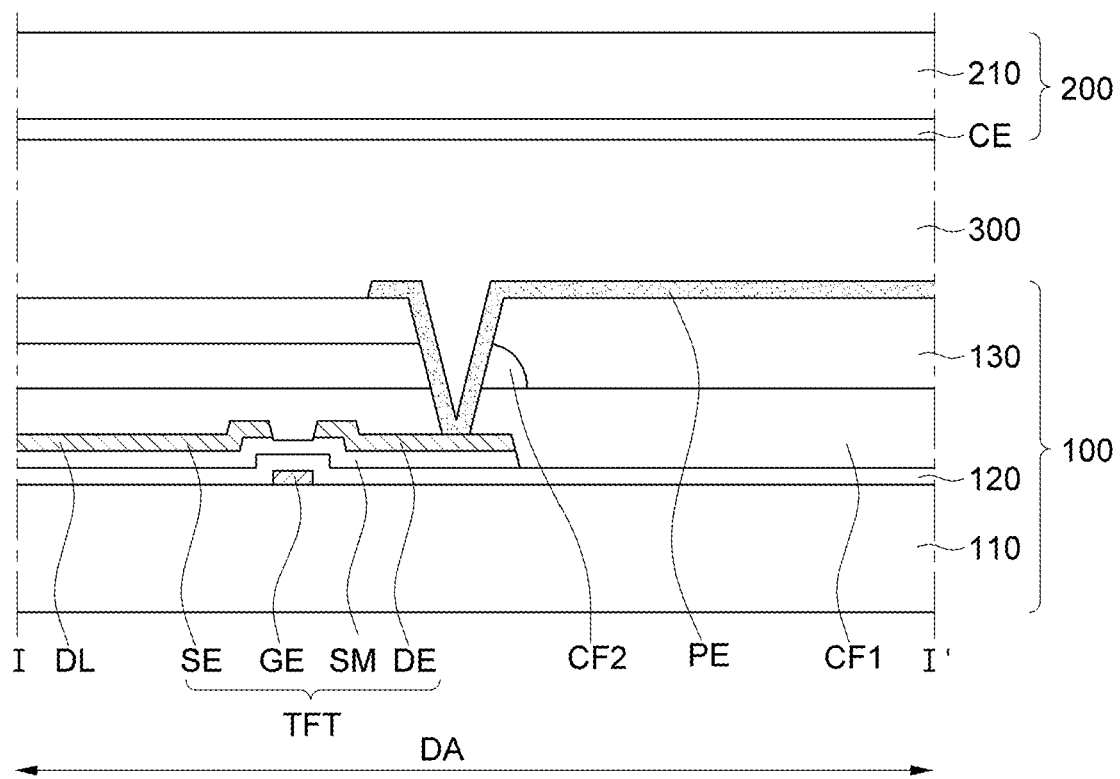
FIG. 3 is a cross-sectional view taken along line of FIG. 2.
Figure 4A:
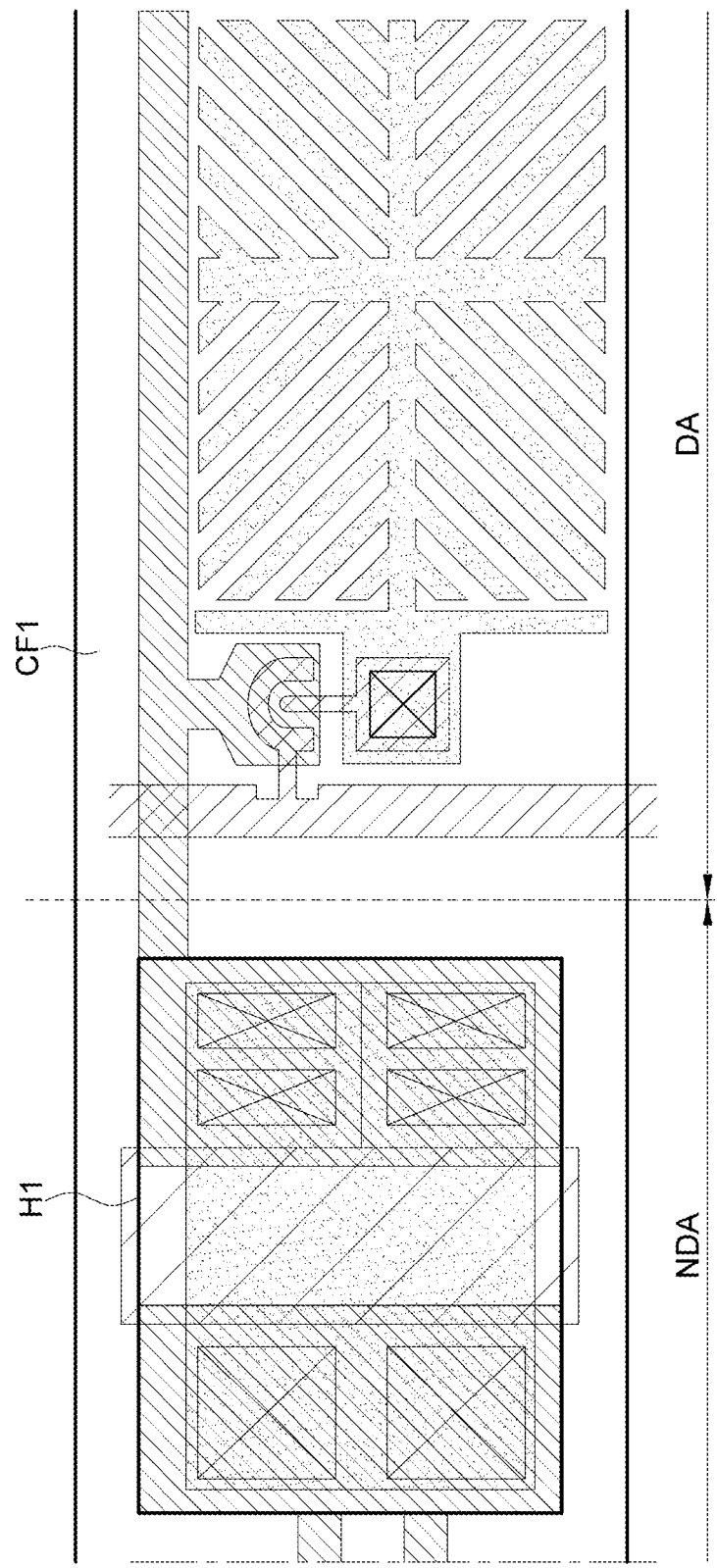
FIG. 4A is a plan view illustrating a portion "A" of a first color filter according to an exemplary embodiment of the invention.
Figure 4B:
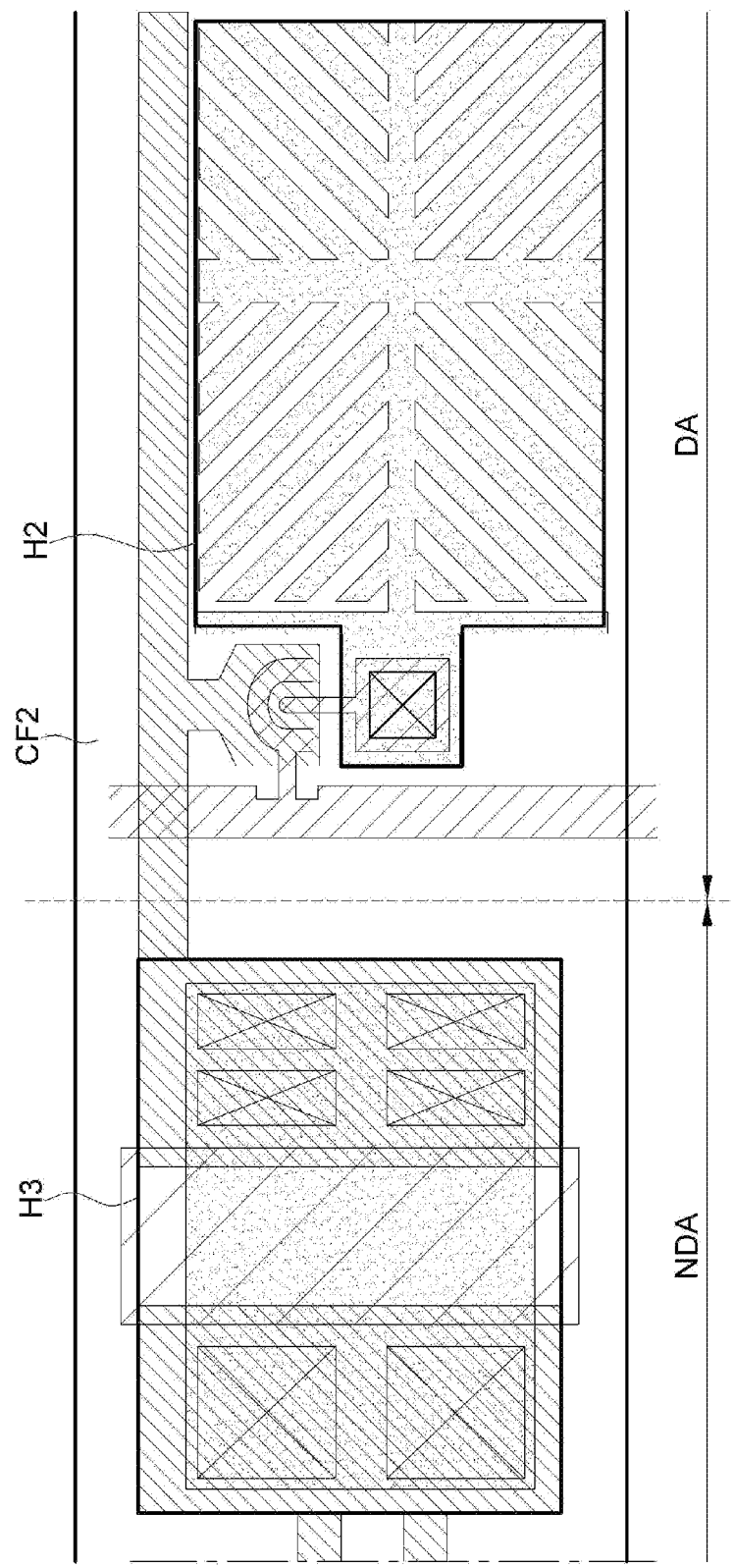
FIG. 4B is a plan view illustrating a portion "A" of a second color filter according to an exemplary embodiment of the invention.
Figure 5:
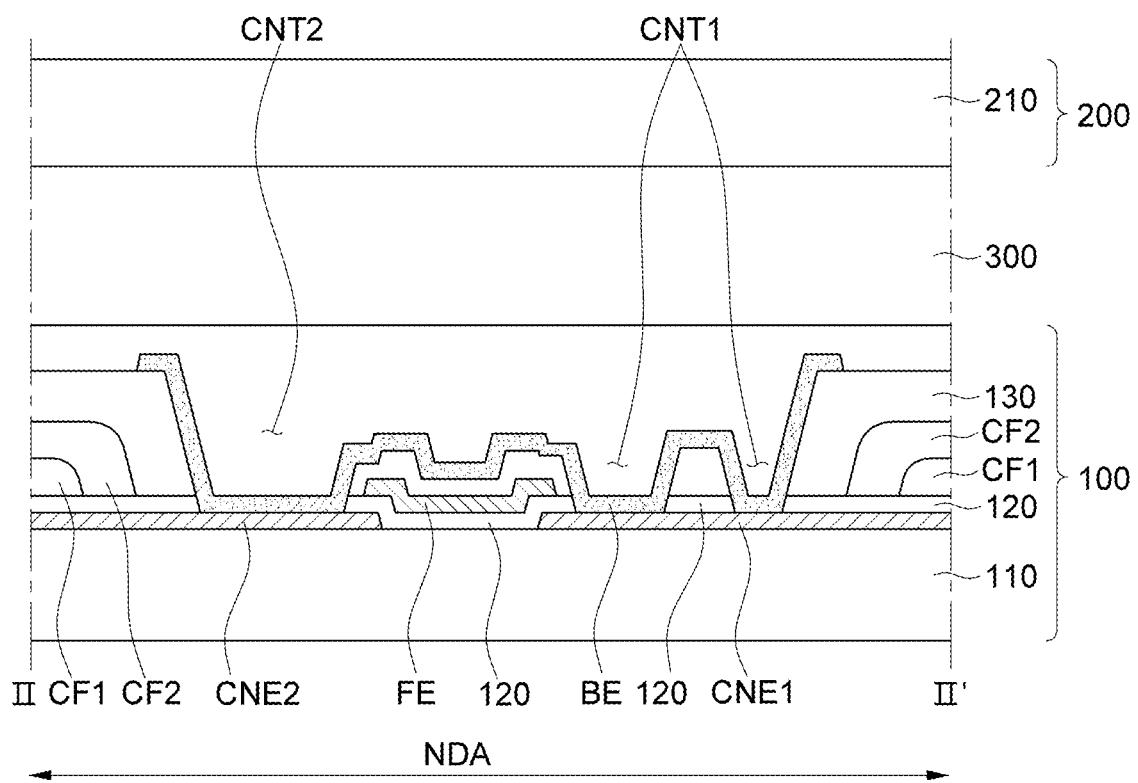
FIG. 5 is a cross-sectional view taken along line II-II' of FIG. 2.

FIG. 2 is a enlarged view of a portion "A" in FIG. 1; FIG. 3 is a cross-sectional view taken along line of FIG. 2; FIG. 4A is a plan view illustrating a portion "A" of a first color filter according to an exemplary embodiment of the invention; FIG. 4B is a plan view illustrating a portion "A" of a second color filter according to an exemplary embodiment of the invention; and FIG. 5 is a cross-sectional view taken along line II-II' of FIG. 2.

The first panel 100 includes a first substrate 110, a gate line GL, a data line DL, a thin film transistor TFT, a gate insulating layer 120, color filters CF1 and CF2, an insulating interlayer 130, and a pixel electrode PE, as illustrated in FIGS. 2 and 3.

The first substrate 110 is an insulating substrate including transparent glass or plastic.

The thin film transistor TFT includes a gate electrode GE, a semiconductor layer SM, a source electrode SE, and a drain electrode DE.

The gate line GL and the gate electrode GE are disposed on the first substrate 110. A connection portion (e.g., an end portion) of the gate line GL may have a larger area than another portion of the gate line GL so as to be connected to another layer or an external driving circuit. At least one of the gate line GL and the gate electrode GE may include or be formed of one of: aluminum (Al) or alloys thereof, silver (Ag) or alloys thereof, copper (Cu) or alloys thereof, or molybdenum (Mo) or alloys thereof. Alternatively, at least one of the gate line GL and the gate electrode GE may include or be formed of one of: chromium (Cr), tantalum (T), and/or titanium (Ti). In an exemplary embodiment, at least one of the gate line GL and the gate electrode GE may have a multilayer structure including at least two conductive layers that have different physical properties.

The gate insulating layer 120 is disposed on the gate line GL and the gate electrode GE. The gate insulating layer 120 may be located over an entire surface of the first substrate 110 including the gate line GL and the gate electrode GE. The gate insulating layer 120 may include or be formed of silicon nitride ($SiN_x$) or silicon oxide ($SiO_x$). The gate insulating layer 120 may have a multilayer structure including at least two insulating layers having different physical properties.

The semiconductor layer SM is disposed on the gate insulating layer 120. In this exemplary embodiment, the semiconductor layer SM overlaps the gate electrode GE. The semiconductor layer SM may include or be formed of amorphous silicon, polycrystalline silicon, or the like.

Although not illustrated, an ohmic contact layer may be located on the semiconductor layer SM. The ohmic contact layer may include or be formed of silicide or n+ hydrogenated amorphous silicon doped with n-type impurities, e.g., phosphorus (P), at high concentration. The ohmic contact layer may be placed on the semiconductor layer SM in pairs.

The source electrode SE is disposed on a portion of the semiconductor layer SM. The source electrode SE extends from the data line DL. For example, as illustrated in FIG. 2, the source electrode SE has a shape protruding from the data line DL toward the gate electrode GE. The source electrode SE overlaps the semiconductor layer SM and the gate electrode GE. The source electrode SE may include or be formed of a refractory metal, such as molybdenum, chromium, tantalum, titanium, and/or an alloy thereof. The source electrode SE may have a multilayer structure including a refractory metal layer and a low resistance conductive layer. Examples of the multilayer structure may include or be formed of: a double-layer structure including a chromium or molybdenum (alloy) lower layer and an aluminum (alloy) upper layer; and a triple-layer structure including a molybdenum (alloy) lower layer, an aluminum (alloy) intermediate layer, and a molybdenum (alloy) upper layer. Alternatively, the source electrode SE may include or be formed of any suitable metals and/or conductors rather than the aforementioned materials.

The drain electrode DIE contacts another portion of the semiconductor layer SM. The drain electrode DE overlaps the gate electrode GE and the semiconductor layer SM. The drain electrode DE is connected to the pixel electrode PE. The drain electrode DE may include a substantially same material and may have a substantially same structure (a multilayer structure) as those of the aforementioned source electrode SE. That is, the drain electrode DE and the source electrode SE may be simultaneously formed in a substantially same process.

The gate electrode GE, the source electrode SE, and the drain electrode DE together with the semiconductor layer SM define a thin film transistor TFT. In this exemplary embodiment, a channel of the thin film transistor TFT is located at a portion of the semiconductor layer SM between the source electrode SE and the drain electrode DE. The portion of the semiconductor layer SM corresponding to the channel may have a thickness less than another portion thereof.

The data line DL is located on the gate insulating layer 120. Although not illustrated, a connection portion (e.g., an end portion) of the data line DL may have a larger area than another portion of the data line DL so as to be connected to another layer or an external driving circuit. The data line DL crosses the gate line GL. Although not illustrated, a portion of the data line DL that crosses the gate line GL may have a line width less than a line width of another portion of the data line DL. Accordingly, a parasitic capacitance between the data line DL and the gate line GL may be reduced. The data line DL may also include the same material and may have substantially the same structure (a multilayer structure) as those of the aforementioned source electrode SE. That is, the data line DL and the source electrode SE may be substantially simultaneously formed in a substantially same process.

A first color filter CF1, a second color filter CF2, and a third color filter (not illustrated) are disposed on the gate insulating layer 120, the data line DL, the source electrode SE, and the drain electrode DE. Each of the color filters is disposed above each pixel. Each of the first color filter CF1, the second color filter CF2, and the third color filter may be any one of a red color filter, a green color filter, and a blue color filter. For example, the first color filter CF1 may be a red color filter, the second color filter CF2 may be a blue color filter, and the third color filter may be a green color filter.

Referring to FIGS. 2 and 4A, the first color filter CF1 may be a red color filter, as described above. The first color filter CF1 may be disposed on the pixel electrode PE of a red pixel in the display area DA. In addition, according to an exemplary embodiment of the invention, the first color filter CF1 may be disposed on the gate line GL, the data line DL, and the thin film transistor TFT. Accordingly, although not illustrated, the first color filter CF1 may not be disposed on the pixel electrodes PE of the green pixel and the blue pixel.

According to an exemplary embodiment of the invention, the first color filter CF1 is disposed apart from a first contact hole CNT1 and a second contact hole CNT2, which will be described below, in the non-display area NDA. The first color filter CF1 is disposed so as to surround the first contact hole CNT1 and the second contact hole CNT2 on a plane. That is, the first color filter CF1 may have a first hole H1 at an area where the first contact hole CNT1 and the second contact hole CNT2 are defined.

Referring to FIGS. 2 and 4B, the second color filter CF2 may be a blue color filter, as described above. The second color filter CF2 may be disposed on the pixel electrode PE of a blue pixel in the display area DA. Further, according to an exemplary embodiment of the invention, the second color filter CF2 may be disposed on the gate line GL, the data line DL, and the thin film transistor TFT. Accordingly, as illustrated in FIG. 4B, the second color filter CF2 may not be disposed on the pixel electrodes PE of the red pixel and the green pixel. That is, the second color filter CF2 may have a second hole H2 at an area where the red pixel electrode and the green pixel electrode are disposed.

According to an exemplary embodiment of the invention, the second color filter CF2 is disposed apart from the first contact hole CNT1 and the second contact hole CNT2, which will be described below, in the non-display area NDA. The second color filter CF2 is disposed so as to surround the first contact hole CNT1 and the second contact hole CNT2. That is, the second color filter CF2 may have a third hole H3 at an area where the first contact hole CNT1 and the second contact hole CNT2 are defined.

According to an exemplary embodiment of the invention, the second color filter CF2 may be disposed to overlap the first color filter CF1. For example, the second color filter CF2 may overlap the first color filter CF1 on the gate line GL, the data line DL, and the thin film transistor TFT. Accordingly, light emitted from a backlight may be substantially prevented from being emitted to the front of the display device at an area where the first color filter CF1 and the second color filter CF2 overlap each other. That is, the first color filter CF1 and the second color filter CF2 may overlap each other to serve as a light blocking layer.

The first color filter CF1, the second color filter CF2 and the third color filter may include a photosensitive organic material.

The insulating interlayer 130 is disposed on the gate insulating layer 120, the first color filter CF1, and the second color filter CF2. In this exemplary embodiment, the insulating interlayer 130 may be located over an entire surface of the first substrate 110 including the gate insulating layer 120, the first color filter CF1, and the second color filter CF2. The insulating interlayer 130 may include or be formed of an organic material.

The pixel electrode PE is connected to the drain electrode DE through a drain contact hole DCH. The pixel electrode PE is located on the insulating interlayer 130. The pixel electrode PE may include or be formed of a transparent conductive material such as indium tin oxide (ITO) or indium zinc oxide (IZO). In this exemplary embodiment, ITO may be a polycrystalline material or a monocrystalline material, and IZO may also be a polycrystalline material or a monocrystalline material.

Although not illustrated, a lower alignment layer may be disposed on the pixel electrode PE. The lower alignment layer may be a vertical alignment layer and may include a photoreactive material.

The second substrate 210 is an insulating substrate including transparent glass or plastic.

The common electrode CE is disposed on the second substrate 112. The common electrode CE may include or be formed of a transparent conductive oxide, such as indium tin oxide (ITO), indium zinc oxide (IZO), or aluminum zinc oxide (AZO).

Although not illustrated, an upper alignment layer may be disposed on the common electrode CE. The upper alignment layer may include or be formed of a material substantially the same as a material included in the lower alignment layer described above.

When facing surfaces between the first substrate 110 and the second substrate 210 are defined as upper surfaces of the corresponding substrates, and surfaces located on the opposite sides of the upper surfaces are respectively defined as lower surfaces of the corresponding substrates, a polarizer may be disposed on each of the lower surface of the first substrate 110 and the lower surface of the second substrate 210.

The liquid crystal layer 300 may include liquid crystal molecules. The liquid crystal molecules of the liquid crystal layer 300 may have a structure in which a major axis thereof is aligned parallel to one of the first substrate 110 and the second substrate 210, and the direction is spirally twisted about 90 degrees from a rubbing direction of the alignment layer of the first substrate 110 to the second substrate 210. Alternatively, the liquid crystal layer 300 may include vertically aligned liquid crystal molecules.

Referring to FIG. 2, a first connection electrode CNE1 is disposed in the non-display area NDA. The first connection electrode CNE1 is connected to the gate line GL. The first connection electrode CNE1 may include a material substantially the same as a material included in the gate line GL, and the gate electrode GE. The first connection electrode CNE1 may be formed unitarily with the gate line Gl and the gate electrode GE.

A second connection electrode CNE2 is disposed apart from the first connection electrode CNE1 in the non-display area NDA. The second connection electrode CNE2 may include a material substantially the same as a material included in the gate line GL, the gate electrode GE, and the first connection electrode CNE1.

According to an exemplary embodiment of the invention, since the second connection electrode CNE2 is disposed apart from the first connection electrode CNE1 which is connected to the gate line GL, transmission of any static electricity that is generated from the outside of the first panel 100 in the manufacturing process of the display panel to the inside of the first panel 100 may be substantially prevented. As such, according to an exemplary embodiment of the invention, display defects of the display device due to the static electricity that may occur outside the display panel during the manufacturing process of the display panel may be substantially prevented.

The gate insulating layer 120 is disposed on at least a portion of the first connection electrode CNE1 and at least a portion of the second connection electrode CNE2. The gate insulating layer 120 has a first contact hole CNT1 for exposing the first connection electrode CNE1 and a second contact hole CNT2 for exposing the second connection electrode CNE2. Accordingly, the gate insulating e 120 is disposed between the first connection electrode CNE1 and the second connection electrode CNE2 on a plane, and at least a portion of the gate insulating layer 120 may overlap the first connection electrode CNE1 and the second connection electrode CNE2.

A floating electrode FE is disposed on the gate insulating layer 120 disposed on at least a portion of the first connection electrode CNE1 and at least a portion of the second connection electrode CNE2. For example, the floating electrode is disposed on the gate insulating layer disposed on one end portion of the first connection electrode CNE1 and one end portion of the second connection electrode CNE2. Accordingly, the floating electrode FE may at least partially overlap the first connection electrode CNE1 and the second connection electrode CNE2. The floating electrode FE is disposed on a layer different from a layer on which the first connection electrode CNE1 and the second connection electrode CNE2 are disposed, and is not electrically connected thereto because it is insulated therefrom by the gate insulating layer 120.

According to an exemplary embodiment of the invention, the floating electrode FE may substantially prevent light emitted from the backlight unit (not illustrated) from being emitted between the first connection electrode CNE1 and the second connection electrode CNE2. As such, the floating electrode FE may substantially prevent light leakage in the non-display area of the display device.

The insulating interlayer 130 is disposed on the floating electrode FE. Accordingly, the floating electrode FE may be insulated from a bridge electrode BE, which is disposed on the insulating interlayer 130.

The first color filter CF1 and the second color filter CF2 may be disposed on the gate insulating layer 120.

The insulating interlayer 130 is disposed on the gate insulating layer 120, the first color filter CF1, the second color filter CF2, and the floating electrode FE. The insulating interlayer 130 has a first contact hole CNT1 for exposing the first connection electrode CNE1 and a second contact hole CNT2 for exposing the second connection electrode CNE2.

The insulating interlayer 130 may at least partially overlap the first connection electrode CNE1 and the second connection electrode CNE2.

The insulating interlayer 130 is disposed between the floating electrode FE and the bridge electrode BE.

The bridge electrode BE is disposed on the first connection electrode CNE1, the second connection electrode CNE2, and the floating electrode FE. The bridge electrode BE is connected to the first connection electrode CNE1 through the first contact hole CNT1 and to the second connection electrode CNE2 through the second contact hole CNT2. Accordingly, the bridge electrode BE electrically connects the first connection electrode CNE1 and the second connection electrode CNE2.

The bridge electrode BE may include a material substantially the same as a material included in the pixel electrode PE. The bridge electrode BE and the pixel electrode PE may be formed through substantially the same process.

As illustrated in FIG. 5, the common electrode CE may not be disposed in the non-display area NDA.

Hereinafter, a display device according to another exemplary embodiment of the present invention will be described with reference to FIGS. 6 to 8.

Figure 6:
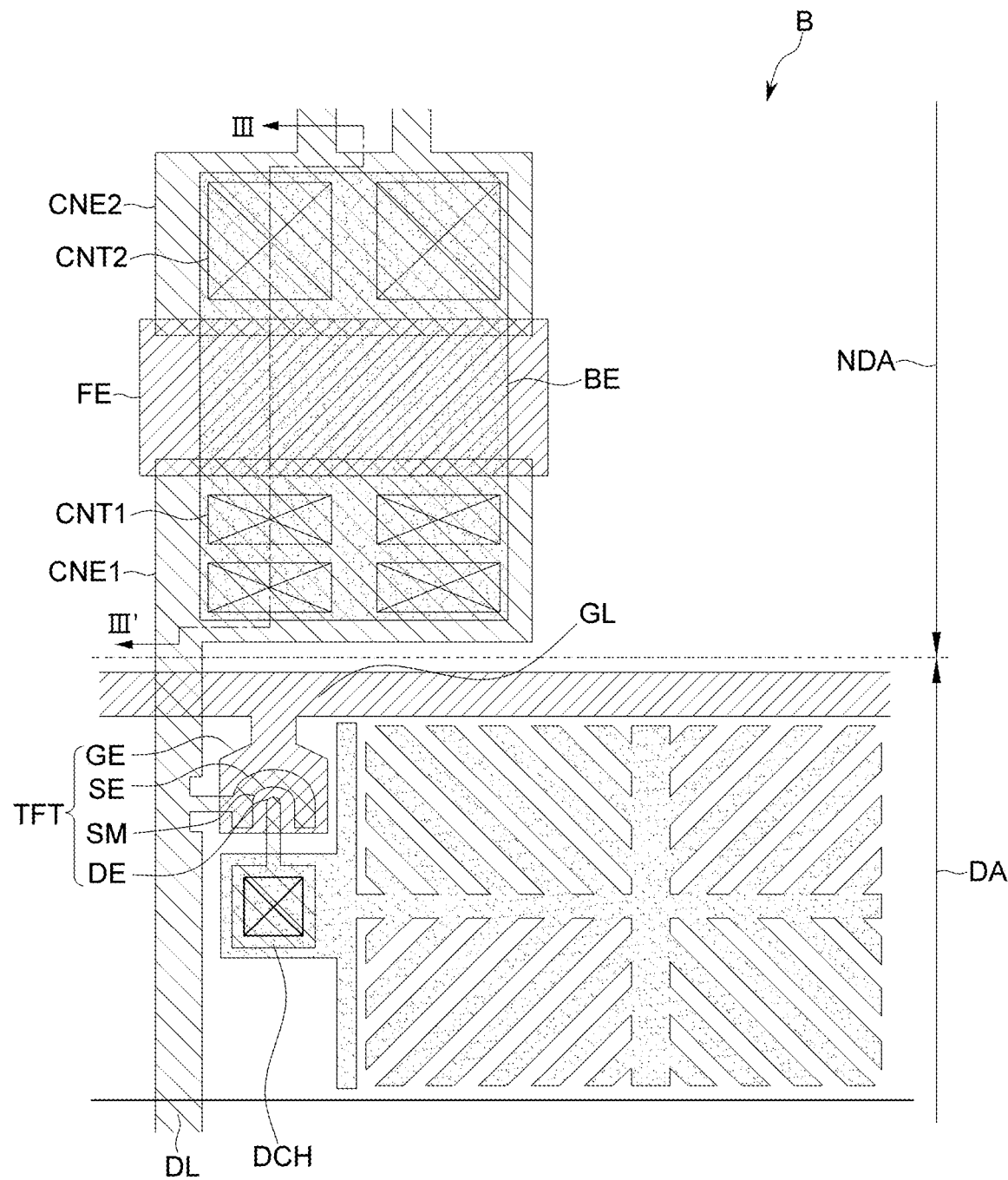
FIG. 6 is an enlarged view of a portion "B" in FIG. 1.
Figure 7A:
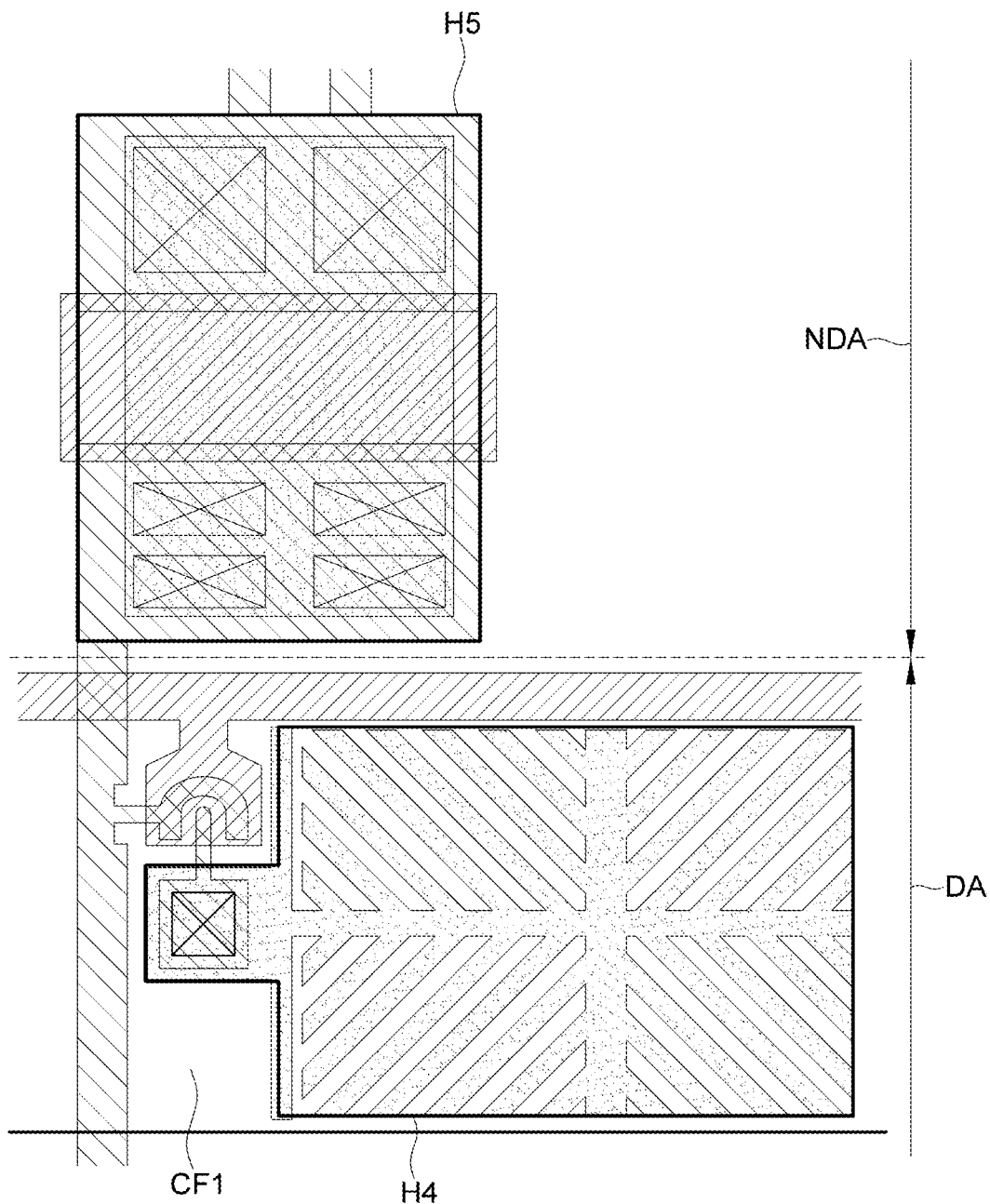
FIG. 7A is a plan view illustrating a portion "B" of a first color filter according to another exemplary embodiment of the invention.
Figure 7B:
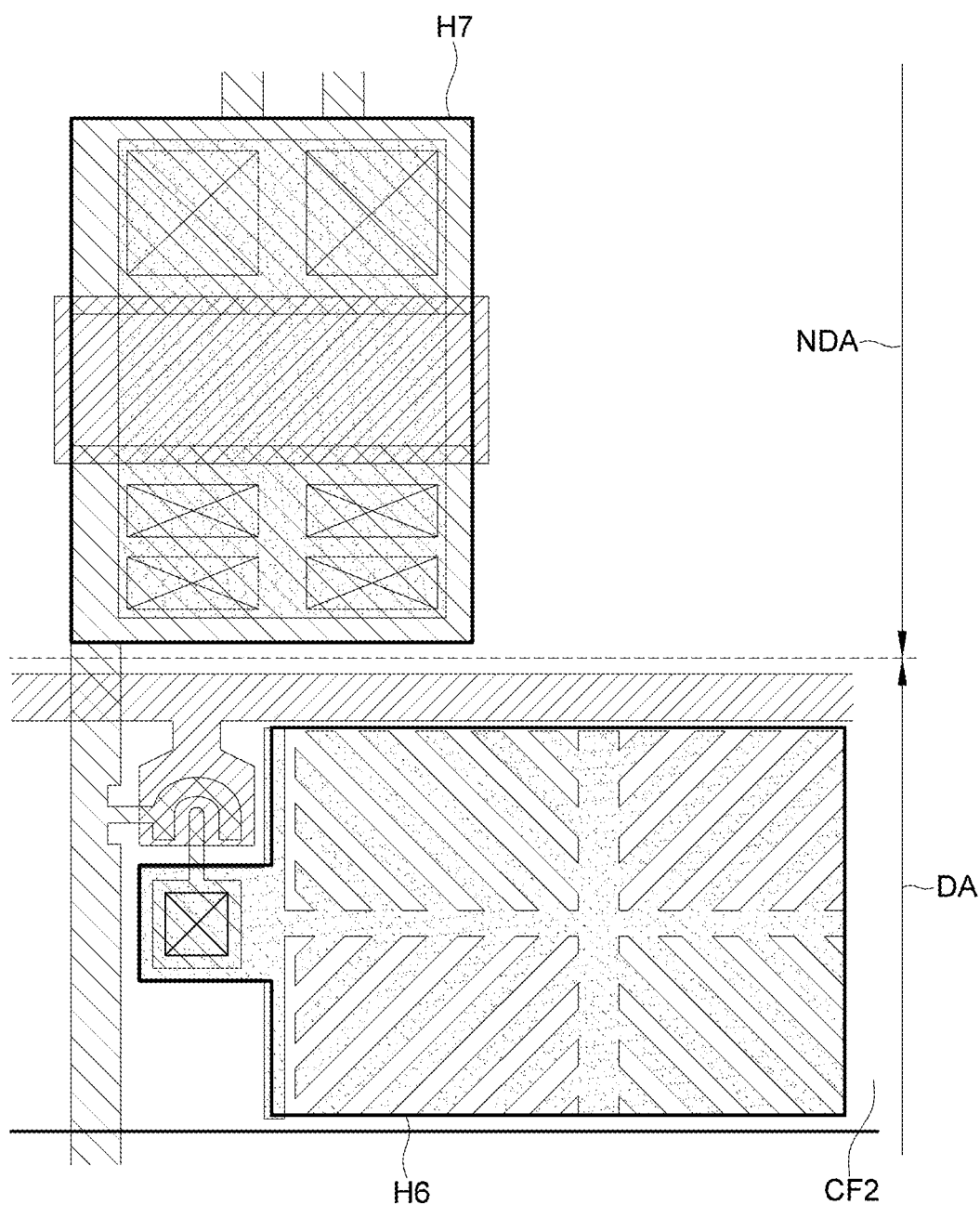
FIG. 7B is a plan view illustrating a portion "B" of a second color filter according to another exemplary embodiment of the invention.
Figure 8:
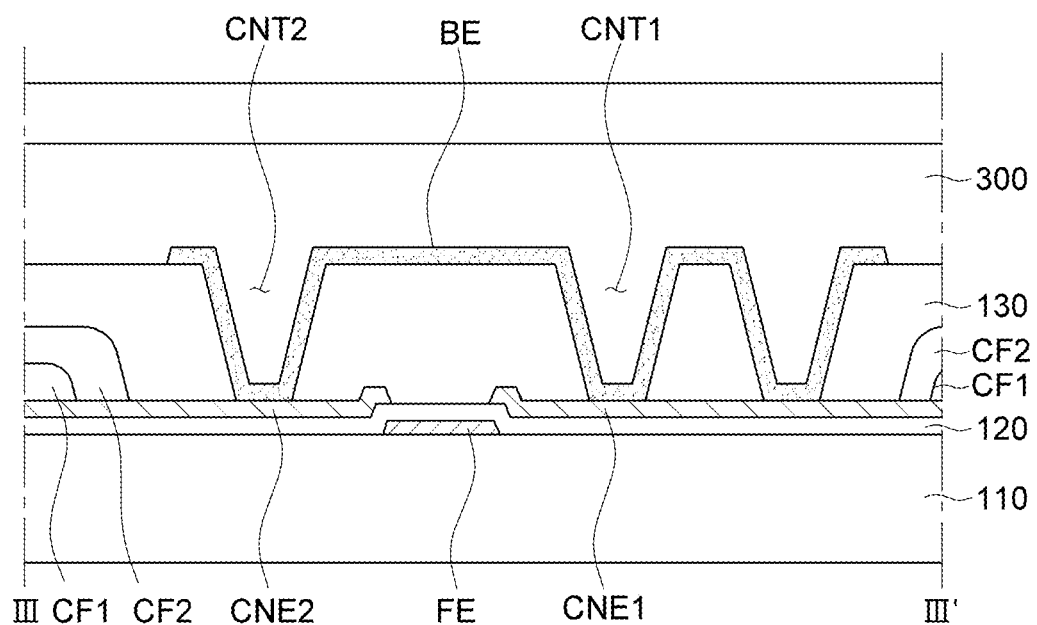
FIG. 8 is a cross-sectional view taken along line III-III' of FIG. 6.

FIG. 6 is a enlarged view of a portion "B" in FIG. 1, FIG. 7A is a plan view illustrating a portion "B" of a first color filter according to another exemplary embodiment of the invention, FIG. 7B is a plan view illustrating a portion "B" of a second color filter according to another exemplary embodiment of the invention, and FIG. 8 is a cross-sectional view taken along line of FIG. 6.

Referring to FIGS. 6 and 7A, the first color filter CF1 may be a red color filter, as described above. The first color filter CF1 may be disposed on the pixel electrode PE of the red pixel in the display area DA. In addition, according to another exemplary embodiment of the invention, the first color filter CF1 may be disposed on the gate line GL, the data line DL, and the thin film transistor TFT. Accordingly, as illustrated in FIG. 7A, the first color filter CF1 may not be disposed on the pixel electrodes PE of the green pixel and the blue pixel. That is, the first color filter CF1 may have a fourth hole H4 at an area where the green pixel electrode and the blue pixel electrode are disposed.

According to an exemplary embodiment of the invention, as illustrated in FIGS. 6 to 8, the first color filter CF1 is disposed apart from the first contact hole CNT1 and the second contact hole CNT2. That is, the first color filter CF1 may have a fifth hole H5 located at an area where the first contact hole CNT1 and the second contact hole CNT2 are defined.

Referring to FIGS. 6 and 7B, the second color filter CF2 may be a blue color filter, as described above. The second color filter CF2 may be disposed on the pixel electrode PE of the blue pixel in the display area DA. In addition, according to another exemplary embodiment of the invention, the second color filter CF2 may be disposed on the gate line GL, the data line DL, and the thin film transistor TFT. Accordingly, as illustrated in FIG. 7B, the second color filter CF2 may not be disposed on the pixel electrodes PE of the red pixel and the green pixel. That is, the second color filter CF2 may have a sixth hole H6 at an area where the red pixel electrode and the green pixel electrode are disposed.

According to one exemplary embodiment of the invention, as illustrated in FIGS. 6 to 8, the second color filter CF2 is disposed apart from the first contact hole CNT1 and the second contact hole CNT2. That is, the second color filter CF2 may have a seventh hole H7 located at an area where the first contact hole CNT1 and the second contact hole CNT2 are defined.

According to one exemplary embodiment of the invention, the second color filter CF2 may be disposed to overlap the first color filter CF1. For example, the second color filter CF2 may overlap the first color filter CF1 on the gate line GL, the data line DL, and the thin film transistor TFT.

Referring to FIGS. 6 and 8, the floating electrode FE is disposed in the non-display area NDA. The floating electrode FE is disposed on the first substrate 110. The floating electrode FE may at least partially overlap the first connection electrode CNE1 and the second connection electrode CNE2. The floating electrode FE is disposed between the first connection electrode CNE1 and the second connection electrode CNE2 on a plane.

According to another exemplary embodiment of the invention, the floating electrode FE may substantially prevent light emitted from the backlight unit (not illustrated) from being emitted between the first connection electrode CNE1 and the second connection electrode CNE2. As such, according to another exemplary embodiment of the invention, the floating electrode FE may substantially prevent light leakage in the non-display area of the display device.

The gate insulating layer 120 is disposed on the floating electrode FE. That is, the gate insulating layer 120 is disposed on the first substrate 110 including the floating electrode FE.

The first connection electrode CNE1 is disposed in the non-display area NDA. The first connection electrode CNE1 is connected to the data line DL. The first connection electrode CNE1 may include a material substantially the same as a material included in the data line DL, the source electrode SE and the drain electrode DE. The first connection electrode CNE1 may be formed unitarily with the data line DL and the source electrode SE.

According to another exemplary embodiment of the invention, the first connection electrode CNE1 may at least partially overlap the floating electrode FE. The first connection electrode CNE1 and the floating electrode FE are disposed on different layers. In addition, the first connection electrode CNE1 and the floating electrode FE are insulated from each other by the gate insulating layer and are not electrically connected to each other even if they overlap each other.

The second connection electrode CNE2 is disposed apart from the first connection electrode CNE1 in the non-display area NDA. The second connection electrode CNE2 may include a material substantially the same as a material included in the data line DL, the source electrode SE, the drain electrode DE, and the first connection electrode CNE1.

According to another exemplary embodiment of the invention, since the second connection electrode CNE2 is disposed apart from the first connection electrode CNE1, which is connected to the data line DL, static electricity generated from the outside of the first panel 100 during the manufacturing process of the display panel may be substantially prevented from being transmitted to the inside of the first panel 100. As such, according to another exemplary embodiment of the invention, display detects of the display device due to the static electricity that may occur outside the display panel during the manufacturing process of the display panel may be substantially prevented.

According to another exemplary embodiment of the invention, the second connection electrode CNE2 may at least partially overlap the floating electrode FE. The second connection electrode CNE2 and the floating electrode FE are disposed on different layers. In addition, the second connection electrode CNE2 and the floating electrode FE are insulated from each other by the gate insulating layer and are not electrically connected to each other even if they overlap each other.

The first color filter CF1 and the second color filter CF2 may be disposed apart from the first contact hole CNT1 and the second contact hole CNT2 on a plane.

The insulating interlayer 130 is disposed on the gate insulating layer 120, the first connection electrode CNE1, and the second connection electrode CNE2, the first color filter CF1 and the second color filter CF2. The insulating interlayer 130 has a first contact hole CNT1 for exposing the first connection electrode CNE1, and a second contact hole CNT2 for exposing the second connection electrode CNE2.

The insulating interlayer 130 may at least partially overlap the first connection electrode CNE1 and the second connection electrode CNE2.

The insulating interlayer 130 is disposed between the floating electrode FE and the bridge electrode BE.

The bridge electrode BE is disposed on the first connection electrode CNE1, the second connection electrode CNE2, and the insulating interlayer 130. The bridge electrode BE is connected to the first connection electrode CNE1 through the first contact hole CNT1 and to the second connection electrode CNE2 through the second contact hole CNT2. Accordingly, the bridge electrode BE electrically connects the first connection electrode CNE1 and the second connection electrode CNE2.

As set forth hereinabove, the display device according to exemplary embodiments may substantially prevent light leakage generated in the non-display area of the display device and display defects due to the static electricity transmitted from the outside.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a substrate comprising a display area and a non-display area;
    a thin film transistor disposed in the display area;
    a first connection electrode disposed in the non-display area and connected to the thin film transistor;
    a second connection electrode disposed in the non-display area and disposed apart from the first connection electrode;

a first insulating layer disposed on the substrate and overlapping one end portion of the first connection electrode and one end portion of the second connection electrode;

a floating electrode disposed on the first insulating layer; and a bridge electrode connected to the first connection electrode through a first contact hole, and connected to the second connection electrode through a second contact hole, wherein:

the first connection electrode and the second connection electrode are disposed on the same layer; and the first insulating layer directly contacts an upper surface of the substrate in an area between the first and second connection electrodes.

2. The display device of claim 1, further comprising a second insulating layer disposed between the floating electrode and the bridge electrode.

3. The display device of claim 1, further comprising a gate line and a data line connected to the thin film transistor.

4. The display device of claim 3, further comprising:

a first color filter overlapping the gate line, the data line, and the thin film transistor; and a second color filter overlapping the first color filter.

5. The display device of claim 4, wherein:

the first color filter is disposed apart from the first contact hole and the second contact hole in the non-display area; and the second color filter is disposed apart from the floating electrode in the non-display area and overlaps the first color filter.

6. The display device of claim 3, wherein the thin film transistor comprises:

a gate electrode connected to the gate line;

a semiconductor layer overlapping the gate electrode;

a source electrode connected to the data line and overlapping a first end portion of the semiconductor layer; and a drain electrode disposed apart from the source electrode and overlapping a second end portion of the semiconductor layer.

7. The display device of claim 6, wherein the first connection electrode is connected to the gate line.

8. The display device of claim 6, wherein the first connection electrode and the second connection electrode comprise a material substantially the same as a material comprised in the gate line and the gate electrode.

9. The display device of claim 6, wherein the floating electrode comprises a material substantially the same as a material comprised in the data line, the source electrode, and the drain electrode.

10. The display device of claim 6, further comprising a pixel electrode connected to the drain electrode, wherein the bridge electrode comprises a material substantially the same as a material comprised in the pixel electrode.

11. The display device of claim 1, wherein:

a first edge portion of the floating electrode is disposed between the first connection electrode and the bridge electrode;

a second edge portion of the floating electrode is disposed between the second connection electrode and the bridge electrode.

12. A display device comprising:

a substrate including a display area and a non-display area;

a thin film transistor disposed in the display area;

a floating electrode disposed in the non-display area;

a first insulating layer disposed on the floating electrode;

a first connection electrode connected to the thin film transistor;

a second connection electrode disposed apart from the first connection electrode in the non-display area; and a bridge electrode connected to the first connection electrode through a first contact hole and connected to the second connection electrode through a second contact hole, wherein:

the floating electrode overlaps the first and second connection electrodes in a plan view; and the first and second connection electrodes are disposed above the first insulating layer and the floating electrode.

13. The display device of claim 12, further comprising a second insulating layer disposed between the floating electrode and the bridge electrode.

14. The display device of claim 12, further comprising a gate line and a data line connected to the thin film transistor.

15. The display device of claim 14, further comprising a first color filter overlapping the gate line, the data line, and the thin film transistor; and a second color filter overlapping the first color filter.

16. The display device of claim 15, wherein:

the first color filter is disposed apart from the first contact hole and the second contact hole in the non-display area; and the second color filter is disposed apart from the floating electrode in the non-display area and overlaps the first color filter.

17. The display device of claim 14, wherein the thin film transistor comprises:

a gate electrode connected to the gate line;

a semiconductor layer overlapping the gate electrode;

a source electrode connected to the data line and overlapping a first end portion of the semiconductor layer; and a drain electrode disposed apart from the source electrode and overlapping a second end portion of the semiconductor layer.

18. The display device of claim 17, wherein the first connection electrode is connected to the gate line.

19. The display device of claim 17, wherein the first connection electrode and the second connection electrode comprise a material substantially the same as a material comprised in the data line, the source electrode, and the drain electrode.

20. The display device of claim 17, wherein the floating electrode comprises a material substantially the same as a material comprised in the gate line and the gate electrode.

21. The display device of claim 17, further comprising a pixel electrode connected to the drain electrode, wherein the bridge electrode comprises a material substantially the same as a material comprised in the pixel electrode.

22. The display device of claim 12, wherein:

a first edge portion of the first connection electrode is disposed between the floating electrode and the bridge electrode;

a second edge portion of the second connection electrode is disposed between the floating electrode and the bridge electrode.

* * * * *